(12) United States Patent
Sinclair (10) Patent No.: US 6,200,141 B1
(45) Date of Patent: *Mar. 13, 2001

(54) LAND GRID ARRAY CONNECTOR (75) Inventor: William Y. Sinclair, Frenchtown, NJ (US)

(73) Assignee: Aries Electronics, Inc., Frenchtown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/133,670

(22) Filed: Aug. 12, 1998

Related U.S. Application Data (60) Provisional application No. 60/056,127, filed on Aug. 19, 1997.

(51) Int. Cl.$^7$ .............................. H01R 12/00; H05K 1/00
(52) U.S. Cl. ................................................ 439/66
(58) Field of Search ..................... 439/66, 99, 591, 439/862, 65, 82; 361/413

(56) References Cited

U.S. PATENT DOCUMENTS

| | | | |
|---|---|---|---|
| 4,240,198 | * 12/1980 | Alonso .................................. | 29/876 |
| 4,330,165 | 5/1982 | Sado . | |
| 4,593,961 | 6/1986 | Cosmo . | |
| 4,820,376 | 4/1989 | Lambert et al. . | |
| 4,927,369 | * 5/1990 | Grabble et al. ....................... | 439/66 |
| 5,309,324 | 5/1994 | Herandez et al. . | |
| 5,427,535 | 6/1995 | Sinclair . | |
| 5,498,166 | * 3/1996 | Rotherberger ........................ | 439/66 |
| 5,531,021 | * 7/1996 | Kolman ................................ | 29/843 |
| 5,573,435 | * 11/1996 | Grabble et al. ...................... | 439/862 |
| 5,653,598 | * 8/1997 | Grabble ................................ | 439/66 |
| 5,704,536 | * 1/1998 | Chen et al. ........................... | 228/41 |
| 5,800,184 | * 9/1998 | Lpoergolo et al. ................... | 439/66 |
| 5,808,875 | * 9/1998 | McMohan et al. ................... | 361/777 |
| 5,980,268 | * 11/1999 | Mischenko et al. ................. | 439/66 |

* cited by examiner

*Primary Examiner*—Brian Sircus
*Assistant Examiner*—Chandrika Prasad
(74) *Attorney, Agent, or Firm*—Anthony J. Casella; Gerald E. Hespos; Michael J. Porco (57) ABSTRACT

A connector assembly is provided for solderless connection to a land grid array integrated circuit package. In the first embodiment of the invention, a plurality of generally Σ-shaped electrical contacts are disposed in through holes formed in a non-conductive substrate. The electrical contacts are maintained within the through holes due to dimensional differences formed therebetween. In the second embodiment of the invention, a plurality of electrical contacts, each having a pad portion, are disposed in a non-conductive substrate, with the respective pad portions registering with an opening of the through hole. Each electrical contact having a spring arm extending through the non-conductive substrate from the pad portion.

7 Claims, 5 Drawing Sheets

LAND GRID ARRAY CONNECTOR

This application claims priority of U.S. Provisional Application Ser. No. 60/056,127, filed Aug. 19, 1997.

BACKGROUND OF THE INVENTION

1. Field of the Invention

The subject invention relates to connectors for connecting integrated circuit packages to printed circuit boards and more specifically, a connector for connecting a land grid array package to a printed circuit board.

2. Description of the Prior Art

Integrated circuits are typically housed within a package which is designed to protect the integrated circuit from damage, provide adequate heat dissipation during operation, and provide electrical connection between the integrated circuit and the leads of a printed circuit board. Several conventional packages are in the prior art including land grid array (LGA), pin grid array (PGA), ball grid array (BGA), and column grid array (CGA).

A LGA package is an integrated circuit package which has a plurality of planar metalized areas, called lands, for interconnection between the leads of the integrated circuit and a printed circuit board. LGA packages can be mounted to a printed circuit board with connectors which have been developed to maintain a solderless connection between an integrated circuit package and a printed circuit board. For example, a "fuzz ball" socket may be used to interconnect a LGA package and a printed circuit board. The "fuzz ball" socket comprises a non-conductive substrate formed with a plurality of through holes which each house a contact element. The contact elements are formed by forcing a predetermined length of gold plated wire into a through hole such that the wire will bend haphazardly into a jumbled contact that extends through the through hole and resembles a piece of steel wool. To mount a LGA package to a printed circuit board, the "fuzz ball" socket is tightly secured to a printed circuit board and, in turn, the LGA package is tightly secured to the "fuzz ball" socket. It can be appreciated, sufficient pressure must be applied to both the "fuzz ball" socket and the LGA package, respectively, to maintain electrical connections between the lands of the LGA package and the printed circuit board via the "fuzz ball" socket.

As the number of lands and corresponding "fuzz ball" contacts are increased, the pitch between contacts is correspondingly decreased and manufacturing problems increased. The placement of individual wires into evermore tightly packed through holes requires tremendous technological developments. Furthermore, "fuzz ball" sockets are relatively expensive due to costly manufacturing including the placement of individual wires into the through holes to form the various "fuzz ball" contacts.

To overcome the shortcomings of the prior art, it is an object of the subject invention to provide a connector for solderless connection between a LGA package and a printed circuit board.

It is also an object of the subject invention to provide a connector which when mounted to a printed circuit board with a LGA package secured thereto, the spacing separating the LGA package from the printed circuit board is virtually equal to the thickness of the non-conductive substrate of the connector.

SUMMARY OF THE INVENTION

To meet the above-stated objects, a connector assembly is provided for solderlessly connecting a LGA package to a printed circuit board. The connector assembly of the subject invention includes a non-conductive substrate formed with a plurality of through holes, each through hole corresponding to a land of the integrated circuit package. In one embodiment of the invention, a generally Σ-shaped resilient electric contact is disposed within each of the through holes to form an electrical connection between the corresponding land and the lead of a printed circuit board. Additionally, as a second embodiment, a resilient electrical contact having a spring arm formed on one end and a ball lead formed on the opposing end is provided within each of the through holes.

With respect to the first embodiment, the generally Σ-shaped resilient electrical contacts are formed with outwardly bent top and bottom arms. In an unbiased state, the bent arms extend slightly beyond the respective outer surfaces of the non-conductive substrate. During use, the LGA package and printed circuit board are respectively placed in tight face-to-face engagement with the non-conductive substrate, thereby, compressing the electric contacts into the non-conductive substrate. The compressed electrical contacts form electrical connections between the LGA package and the printed circuit board. Spring forces reactive to the compression of the electrical contacts, maintain the outer arms of the electrical contacts in tight engagement with the corresponding lands and leads. Also, due to the compression of the electrical contacts, in use, the spacing between the LGA package and the printed circuit board is virtually equal to the thickness of the non-conductive substrate. Consequently, the connector and the LGA package combination can be advantageously assembled and mounted to substantially encompass the actual sum of the dimensions of the LGA package and the connector. With space and volume within a computer being at a premium, dimensional increases added to an assembled, mounted component resulting from the mounting procedure are undesirable.

During assembly, initial contact between the LGA package and the connector, and the printed circuit board and the connector, respectively, is achieved with engagement between the respective apexes of the outwardly bent arms and the corresponding lands of the integrated circuit package or leads of the printed circuit board, respectively. With inward compression, the outwardly bent arms of each of the electric contacts pivot about the center of the respective contact with the apexes moving simultaneously in two coordinate directions, one direction being perpendicular to the substrate and the second direction being parallel to the substrate. As a result, the transverse movement of each of the apexes of the outwardly bent arms, in a direction parallel to the substrate, causes the respective bent arms to wipe the engaged land or lead. As the land or lead is wiped, hydrocarbons, dust and other contaminants are removed, and the electric connection between the contact and the corresponding land and lead is enhanced.

The generally Σ-shaped electric contacts of the first embodiment of the subject invention are formed from beryllium copper segments. The segments are formed with a narrow rectangular configuration defined in a first longitudinal plane and an elongated diamond-shaped configuration defined in a second longitudinal plane, wherein the second longitudinal plane is perpendicular to the first longitudinal plane. In forming the electrical contact of the first embodiment, each of the beryllium copper segments is bent and formed from the narrow rectangular configuration to the generally Σ-shape while maintaining the elongated diamond-shaped profile relative to the second longitudinal plane.

The through holes of the non-conductive substrate of the first embodiment of the socket are respectively defined by two pairs of opposing inner walls. The walls of one pair of inner walls are substantially planar, whereas the walls of the other pair of inner walls are each formed to define an outwardly pointing dihedral angle. Accordingly, each through hole cross-sectionally defines a truncated diamond profile along one coordinate axis and a generally rectangular profile along a second coordinate axis. The taper of the dihedral angles is preferably substantially equal to the taper defined by the elongated diamond profile of the respective electrical contact. With the electrical contacts being disposed in the through holes, the tapered surfaces of the electrical contacts are substantially in face-to-face engagement with the tapered surfaces of the dihedral angle, with the electrical contacts being in an unbiased state. Since the electrical contacts are each formed with an overall length which is greater than the thickness of the non-conductive substrate, the electrical contacts extend through both surfaces of the non-conductive substrate. The mating of the tapered surfaces of the electrical contacts and the through holes maintain the electrical contacts within the non-conductive substrate.

To simplify manufacturing of the first embodiment of the invention, the non-conductive substrate may be formed from two layers disposed in face-to-face engagement in opposing orientations. Each layer is substantially half the overall thickness of the non-conductive substrate with a corresponding plurality of through holes formed therein. The through holes of each layer are respectively defined by four inner walls, which are disposed to form two pairs of opposing inner walls with each pair being in face-to-face alignment. The through holes are disposed about the two layers to define mirror-image patterns. In each of the through holes, the walls of one pair of inner walls are substantially perpendicular to the outer surfaces of the respective layer, whereas, the walls of the second pair of inner walls extend obliquely between the outer surfaces of the respective layer. By placing the outer surfaces of the two layers, in which the large open ends of the through holes are formed, in face-to-face engagement, the assembled non-conductive substrate defines a truncated diamond profile in one coordinate axis and a generally rectangular profile in a second coordinate axis, as described above. The electrical contacts are placed or disposed into the through holes formed in one layer, through the large open ends of the through holes, prior to assembly of the substrate. A vacuum may be induced below the respective layer which will draw the electrical contacts into tight engagement with the respective through holes. With the electrical contacts being disposed in one layer of the non-conductive substrate, the second layer is placed in face-to-face engagement with the first layer and secured thereto through conventional connecting techniques.

It is to be understood that the electrical contacts are maintained within the substrate due to dimensional differences between the contacts and the substrate. Rather than using the overlapping diamond configurations described above, any configuration can be used where the dimensioning of the electrical contacts and the through holes creates an overlap between the ends of the through holes and intermediate portions of the contacts. For example, each of the electrical contacts could each be formed with a protruding rectangular portion along the intermediate length thereof, and the through holes could each correspondingly be formed with a rectangular groove for registering with the rectangular portions of the contacts. Thus, the interference between the registered rectangular portions and grooves would maintain the electrical contacts within the substrate. It should also be understood that, preferably, the electrical contacts and the through holes should be symmetrically formed about the respective centers to utilize the above-described method of forming the substrate as two layers.

In the second embodiment, the non-conductive substrate has two opposing surfaces with a plurality of through holes formed therethrough which each extend from a first end with a constant cross-section from one surface to a point adjacent the opposing surface. The second end of each of the through holes is formed by an inwardly extending edge which is dimensionally defined to be smaller than the constant cross-section portion of the respective through hole.

An electrical contact is provided for each of the through holes comprising a pad portion having opposing top and bottom surfaces, a spring arm extending from the top surface of the pad portion, and a ball lead soldered to the bottom surface of the pad portion. The spring arms of the electrical contacts of the second embodiment are formed with a shape similar to the bent arms of the Σ-shaped electrical contacts, described above.

The electrical contacts of the second embodiment are formed from beryllium copper. Initially, the spring arm is formed from a narrow rectangular segment of beryllium copper, and the pad portion is hingedly connected to the narrow rectangular portion. The segments of beryllium copper are bent to form the spring arms of the respective electrical contacts, and the pad portions are turned about the respective hinged connections to be substantially coaxially aligned with the formed spring arm of the respective electrical contact.

The electrical contacts are disposed within the through holes using any technique known by those skilled in the art, including the induction of a vacuum below the smaller open ends of the through holes. The electrical contacts are disposed in the non-conductive substrate with the pad portions registering with the smaller open ends of the respective through holes. The spring arms of the electrical contacts are dimensioned to extend through the non-conductive substrate and beyond the outer surface of the non-conductive substrate opposite the pad portion. The electrical contacts are maintained within the non-conductive substrate by applying a dry film on the bottom surface of the non-conductive substrate coextensively with the pad portions. Subsequently, through conventional etching techniques, small apertures are etched through the dry film coincident with central areas of the pad portions. Dry film is maintained on portions of the pads to maintain the contacts within the substrate. Solder flux is disposed within the etched apertures and ball leads are, in turn, disposed thereon. Upon heating the entire socket assembly, the ball leads are soldered to the respective pad portions.

The connector of the second embodiment may be mounted on a printed circuit board either through the use of screws or soldering. It should be noted, that the solder initially used to mount the ball leads to the pad portions must have a reflow temperature higher than the reflow temperature of the solder used to mount the connector to the printed circuit board. With this arrangement, unintended reflow of the solder securing the ball leads to the connector may be avoided.

These and other features of the invention will be better understood through a study of the following detailed description of the invention and the accompanying drawings.

DETAILED DESCRIPTION OF THE PREFERRED EMBODIMENTS

Figure 1:
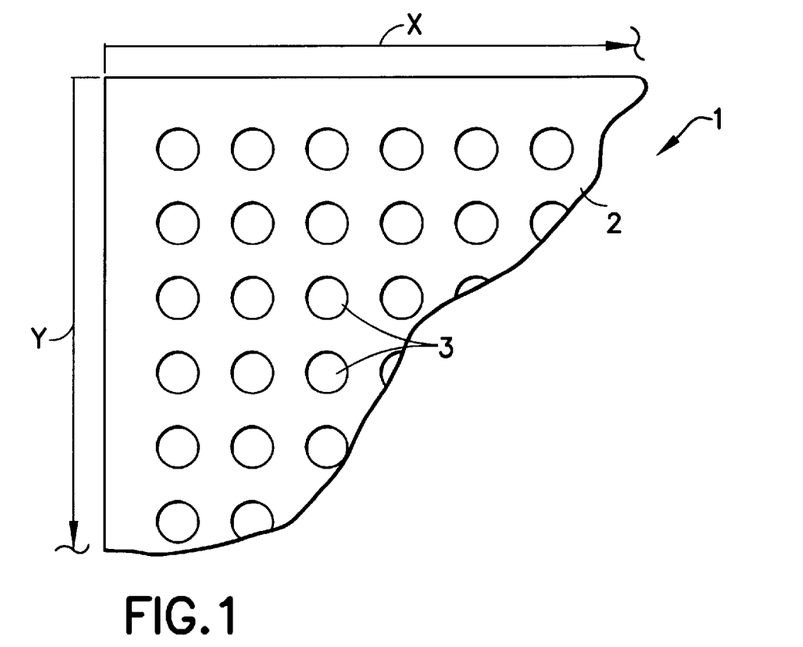
FIG. 1 is a partial view of a LGA integrated circuit package.

This invention is provided for connecting an integrated circuit 1 having a LGA arrangement with other circuitry. Referring to FIG. 1, the circuit 1 is shown schematically having a planar surface 2 formed with a plurality of planar lands 3. The surface 2 and the lands 3 are formed substantially coextensively to define a single plane.

Figure 2:
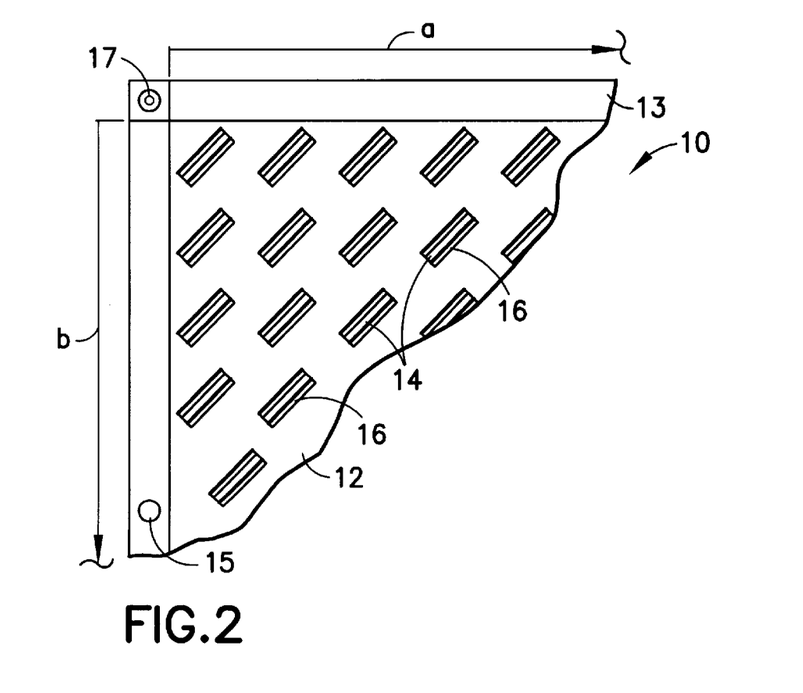
FIG. 2 is a partial plan view of the first embodiment of the invention.

Referring to FIG. 2, a new and improved connector 10 is provided for connecting the circuit 1 to other circuitry. The connector 10 includes a non-conductive substrate 12 with a plurality of electrical contacts 14 mounted in apertures 16 formed through the substrate 12. The number of the electrical contacts 14 will generally correspond to the number of lands 3 provided with the circuit 1. Also, the size of the connector 10 is also generally dependent on the size of the integrated circuit 1. The connector 10 may be formed as a socket for accommodating the circuit 1. Referring to FIG. 2, the non-conductive substrate 12 may be formed with a raised edge 13 which extends about the periphery of the non-conductive substrate 12. The raised edge 13 defines inner dimensions "a" and "b" which will be slightly longer than the respective dimensions "x" and "y" of the integrated circuit 1.

The height of the raised edge 13 is dependent on the thickness of the integrated circuit 1. To ensure a tight connection between the connector 10 and the integrated circuit 1, a lid (not shown) may be provided which can be fastened to the connector 10. To maintain the tight connection between the integrated circuit 1 and the connector 10, the lid may be fastened to the connector by any conventional means, including screws threadedly engaging holes 15 formed in the raised edge 13. Furthermore, the connector 10 can be secured to other circuitry or a desired location by screws passing through the connection holes 17. The location of the holes 15 and the connection holes 17 may be altered.

It should be noted that the connector 10 need not be formed with the same dimensions as the integrated circuit 1 for purposes of this invention. However, the electrical contacts 14 must be disposed in the connector 10 such that pressing contact is achieved between the electrical contacts 14 and the lands 3 of the integrated circuit 1 with the connector 10 being placed in face-to-face contact with the integrated circuit 1. As shown in FIG. 1, the lands 3 may be disposed to define a plurality of rows and columns throughout the surface 2 of the integrated circuit 1. Consequently, although not shown, the electrical contacts 14 are to be aligned in a similar row-column pattern. Alternatively, as shown in FIG. 2, the electrical contacts 14 may be arranged obliquely relative to the edges of the connector 10. Similarly, although not shown, the lands 3 of the integrated circuit 1 would be disposed obliquely relative to the edges thereof. Further patterns and arrangements of the lands 3 and the electrical contacts 14 may be utilized.

Figure 3:
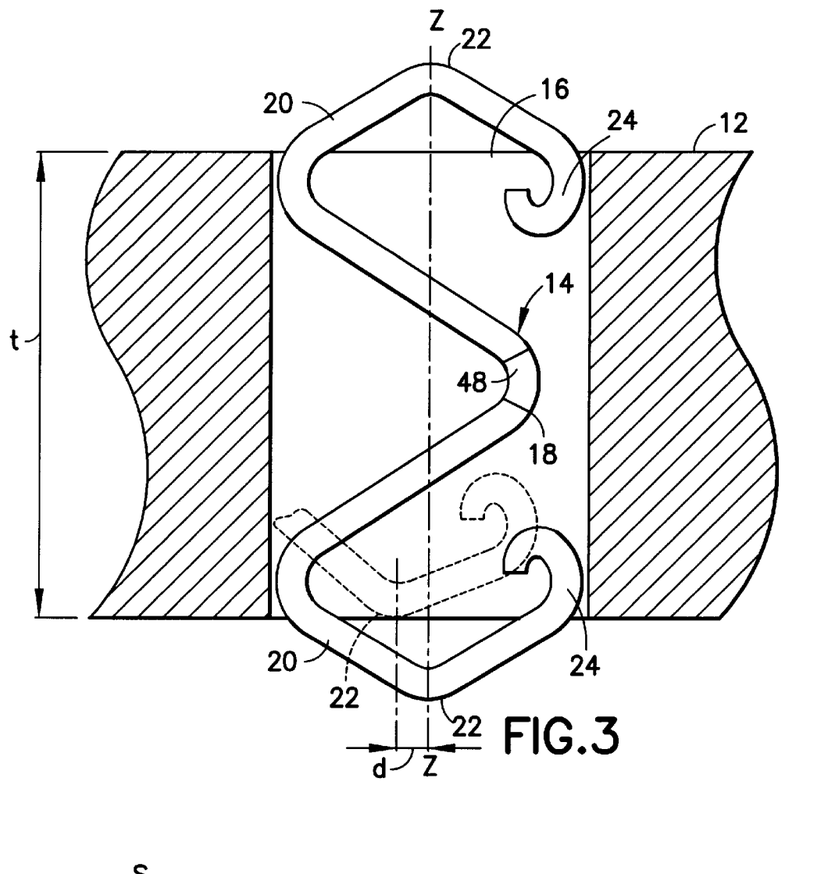
FIG. 3 is a side view of a contact of the first embodiment of the subject invention.

Referring to FIG. 3, the first embodiment of the electrical contact 14 is shown. The electrical contact 14 is generally $\Sigma$-shaped with an overall length greater than the thickness "t" of the substrate 12. Each of the electrical contacts 14 is formed from material having good spring characteristics, such as beryllium copper, which permits resilient contraction of the electrical contacts 14 relative to the substrate 12. Specifically, referring to FIG. 3, the electrical contact 14 can be compressed into the through hole 16 along axis z—z. The electrical contacts 14 are each formed with a central pivot point 18 and two spring arms 20 extending therefrom in opposite directions. The spring arms 20 each define an apex 22 located at points furthest away from the respective center 18. To avoid abrading or damaging the surface of the respective through hole 16, ends 24 of the electrical contacts 14 are bent inwardly and directed generally to the center of the respective through hole 16.

During use, the apexes 22 of the electrical contacts 14 come into contact with the land 3 of the integrated circuit 1 or with a lead, not shown, of other circuitry. During compression of the electrical contact 14 as described below, the apexes 22 are caused to wipe the engaged lead 3 or contact. The wiping effect is generated due to the simultaneous movement of the apexes 22 in two separate coordinate directions. Referring to FIG. 3, as described above, the compression of the electrical contact 14 will cause the apexes 22 to move inwardly towards the center of the substrate 12 generally in the direction of the axis z—z. Simultaneously, the compression of the respective electrical contact 14 causes the spring arms 20 to pivot about the center 18, thereby causing the apexes 22 to move laterally relative to the axis z—z. Consequently, as shown in dash lines in FIG. 3, the apex 22, in a compressed position, is offset by a distance "d" from the original location of the apex 22. The lateral movement of the apex 22, while being in contact with the land 3 or a lead, will cause the surface of the engaged land 3 or lead to be at least partially wiped, thereby enhancing the electrical contact therebetween. To further enhance the wiping effect, the apexes 22 may be formed with non-smooth surfaces.

The connector 10 can not only be used as a socket but also as an interconnector or interposer between stacked integrated circuits. In use, the connector 10 is interposed between two integrated circuits, and the entire assembly is fastened together with the surfaces of the connector being in tight face-to-face engagement with the surfaces of the adjoining integrated circuits. Due to the resiliency of the electrical contacts 14, the electrical contacts 14 cannot be permanently deformed during use, as the above-described prior art "fuzz ball socket". Also, since the electrical contacts 14 can be fully compressed into the substrate 12 of the connector 10, the spacing between an assembled stack of integrated circuits is equal to the thickness of the substrate 12.

Figure 4:
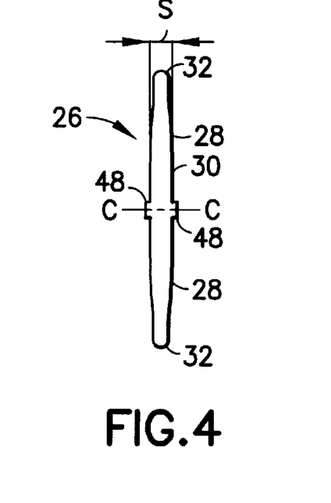
FIG. 4 is a plan view of a segment used to form the contact of the first embodiment of the invention.
Figure 5:
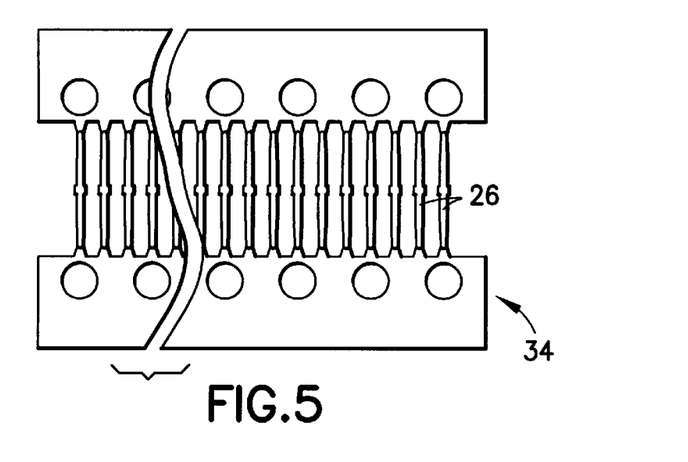
FIG. 5 is a plan view of a blank including a plurality of the segments used to form the contacts of the first embodiment of the subject invention.

The electrical contacts 14 are maintained within the through holes 16 of the substrate 12 due to dimensional differences formed therebetween. Referring to FIG. 4, each of the electrical contacts 14 is preferably formed from a single-thickness segment 26. The segment 26 has a single-thickness defined in a direction normal to the plane of FIG. 4, and the segment 26 is symmetrically formed about a central axis c—c, with tapering portions 28 joining middle portion 30 with ends 32. The middle portion 30 is formed with a width "s". The electrical contact 14 is formed by bending the segment 26 about axis c—c, so as to form respectively the pivot point 18, the spring arms 20 and the curved ends 24 thereof. Referring to FIGS. 3 and 4, the formed electrical contact 14 has a single thickness as viewed along one coordinate direction, as shown in FIG. 3, and a variable thickness as viewed in a second coordinate direction, normal to the first coordinate direction, corresponding to the configuration defined in FIG. 4. For ease of manufacturing, a plurality of the segments 26 can be mass produced by using etching or stamp forming techniques known by those skilled in the art and forming a blank 34, as shown in FIG. 5.

Figure 6:
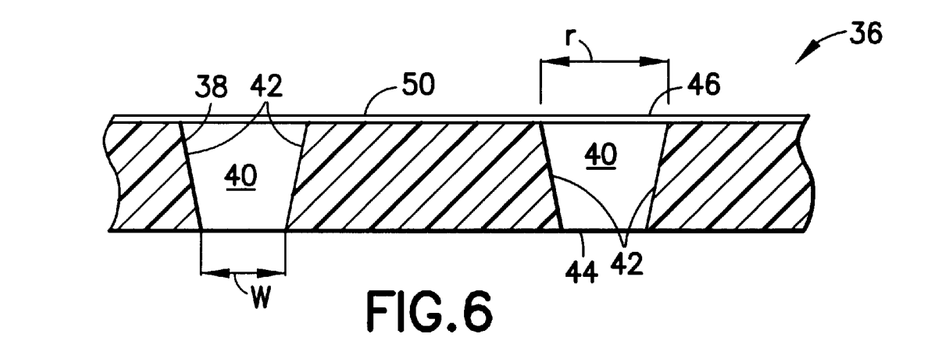
FIG. 6 is a partial cross-sectional view of a layer used to form the non-conductive substrate of the first embodiment of the subject invention.

Preferably, the substrate 12 is formed from two layers 36. Referring to FIG. 6, each of the layers 36 is formed to have a plurality of tapered through holes 38 extending therethrough. Each of the through holes 38 preferably includes two pairs of opposing walls 40 and 42. The walls 40 are substantially perpendicular to the surfaces of the layer 36, whereas the walls 42 are tapered relative thereto. As such, the walls 40 and 42 collectively define a rectangular opening 44 at the base of each of the tapered through holes 38. The width "w" of the base opening 44 must be less than the width "s" defined by the middle portion 30 of the segment 26. Also, the through holes 38 must define an upper opening 46 having a width "r" which is greater than the dimension "s". The through holes 38 are disposed in each pair of the layers 36 as mirror-image patterns.

Figure 8:
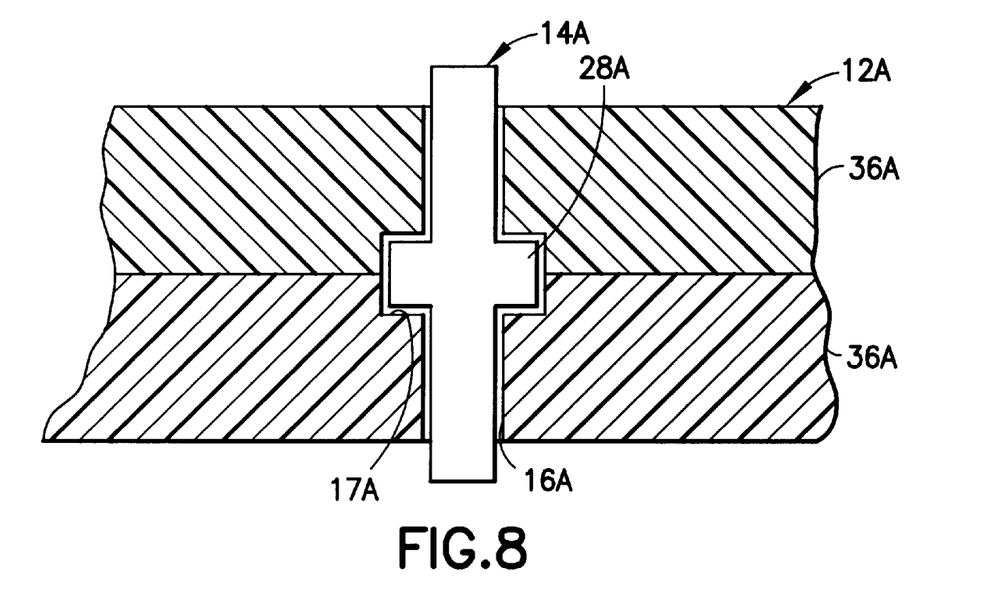
FIG. 8 is a cross-sectional view of an alternative embodiment of the contact of the first embodiment of the invention.
Figure 9:
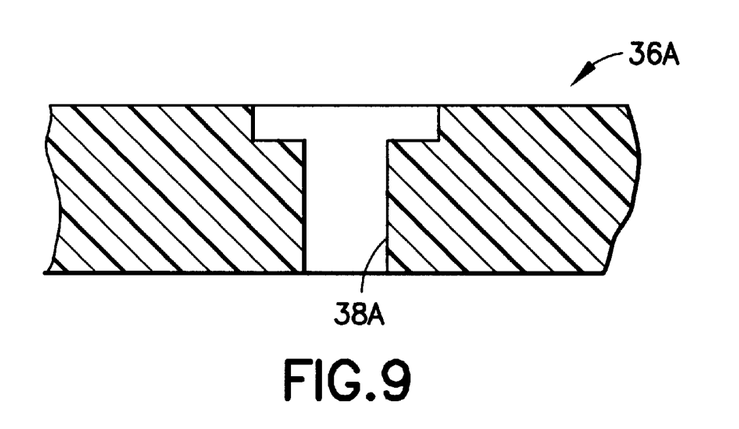
FIG. 9 is a partial cross-sectional view of a layer used to form the non-conductive substrate of the alternative embodiment.

It is to be understood that the electrical contacts 14 are maintained within the substrate 12 due to dimensional differences between the contacts 14 and the respective apertures 16. Rather than using the configurations described above, any configuration can be used where the dimensioning of the electrical contacts 14 and the apertures 16 creates an overlap between the ends of the apertures 16 and intermediate portions of the contacts 14. For example, referring to FIGS. 8 and 9, an electrical contact 14A is shown having outwardly extending fins 28A. The electrical contact 14A is formed as the electrical contacts 14, described above, to define a Σ-shape in a direction normal to the plane of FIG. 8. A substrate 12A is provided having apertures 16A formed therethrough, corresponding to each of the electrical contacts 14A, which define a central slot 17A. The fins 28A of the electrical contact 14A are dimensioned to register with the slot 17A. The registration of the fins 28A in the slot 17A maintains the electrical contact 14A within the substrate 12A. As described above, preferably, the substrate 12A is formed from two identical layers 36A and 36A. Each of the layers 36A is formed with an aperture 38A, which is dimensioned to define half the aperture 16A.

In the preferred embodiment, the connector 10 is formed by placing one of the layers 36 with the upper openings 46 of the through holes 38 being oriented in a gravitationally upward direction. A vacuum is introduced below the layer 36 and a plurality of electrical contacts 14, already having been bent into shape from the segments 26, corresponding to the number of through holes 38 is disposed onto the upward facing surface of the layer 36. Lateral vibration may be applied to the layer 36 so that the electrical contacts 14 are scattered about the upper surface of the layer 36 with the contacts 14 eventually slipping into the through holes 38 and being drawn tightly therein by the induced vacuum. Preferably, the electrical contacts 14 are formed with an overall width, as shown in FIG. 3, being proportionately larger than the thickness of the respective electrical contact 14, shown in FIG. 4. As such, the electrical contacts 14 may only be disposed within the respective through holes 38 with one orientation. Also, since the electrical contacts 14 are symmetrically formed about the respective pivot points 18, the orientation of the electrical contact 14 with the respective through holes 38 is of no significance. With the electrical contacts 14 being disposed within the apertures 38, a second layer 36 can be disposed in face-to-face engagement with the first layer 36 in an opposite orientation, such that each pair of registered through holes 38 collectively define the through hole 16, which is formed to symmetrically taper from the center of the two layers 36. The mirror-image patterns of the two layers 36 allows for the alignment of the pairs of the through holes 38 to respectively define the through holes 16. The difference in dimensions between the base openings 42 and the middle portions 30 of the electrical contacts 14 maintain the electrical contacts within the assembled substrate 12.

Figure 7:
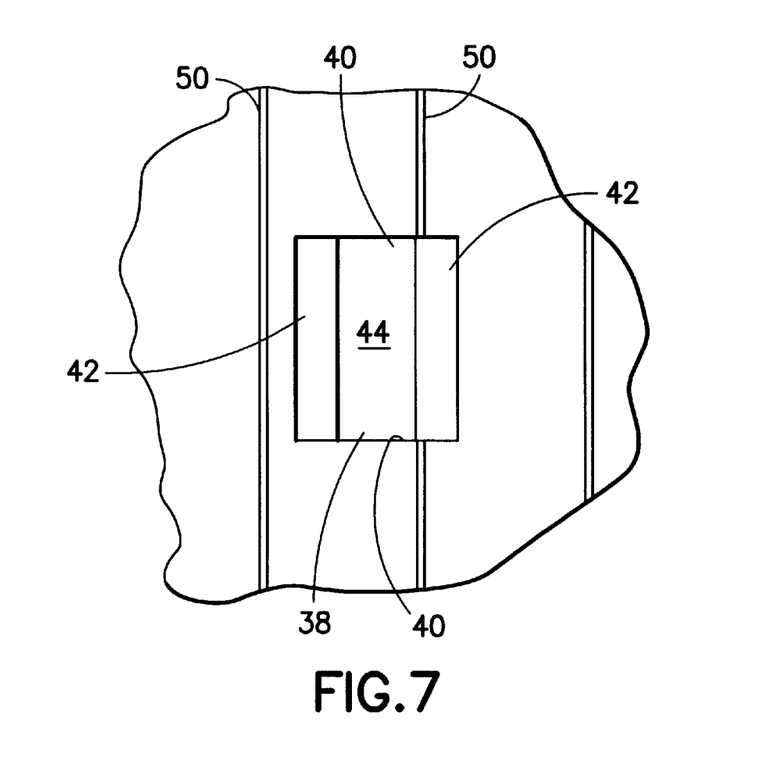
FIG. 7 is a top plan view of a through hole formed in one of the layers used to form the non-conductive substrate of the first embodiment of the invention.

As an additional feature to the above-described inventions, the electrical contacts 14 may be formed with depending tabs 48. As shown in FIG. 4, the depending tabs 48 extend from the segment 26 and may be located along the axis c—c. The tabs 48 extend generally perpendicularly from the electrical contact 14, as shown in FIG. 3. During the above-described method of assembling the connector 10, the tabs 48 prevent adherence between the electrical contacts 14 and, thereby, avoid the placement of more than one of the electrical contacts 14 in a single of the through holes 38. As a further additional feature, each of the layers 36 may be formed with a plurality of parallel ribs 50. Preferably, the ribs 50 are formed on the layers 36 such that, for each pair of the layers 36 used to form the substrate 12, the ribs 50 are aligned to be perpendicular relative to the ribs 50 of the other layer 36. For example, as shown in FIG. 6, the ribs 50 are aligned to be parallel with the walls 40, whereas the ribs 50 shown in FIG. 7 are aligned to be perpendicular to the walls 40. In assembling the layers 36 shown in FIGS. 6 and 7, the ribs 50 would criss-cross. Ultrasonic welding or some other form of heating may be used to melt the ribs 50 and cause the two layers 36 to be bonded together to form the substrate 12.

Figure 10:
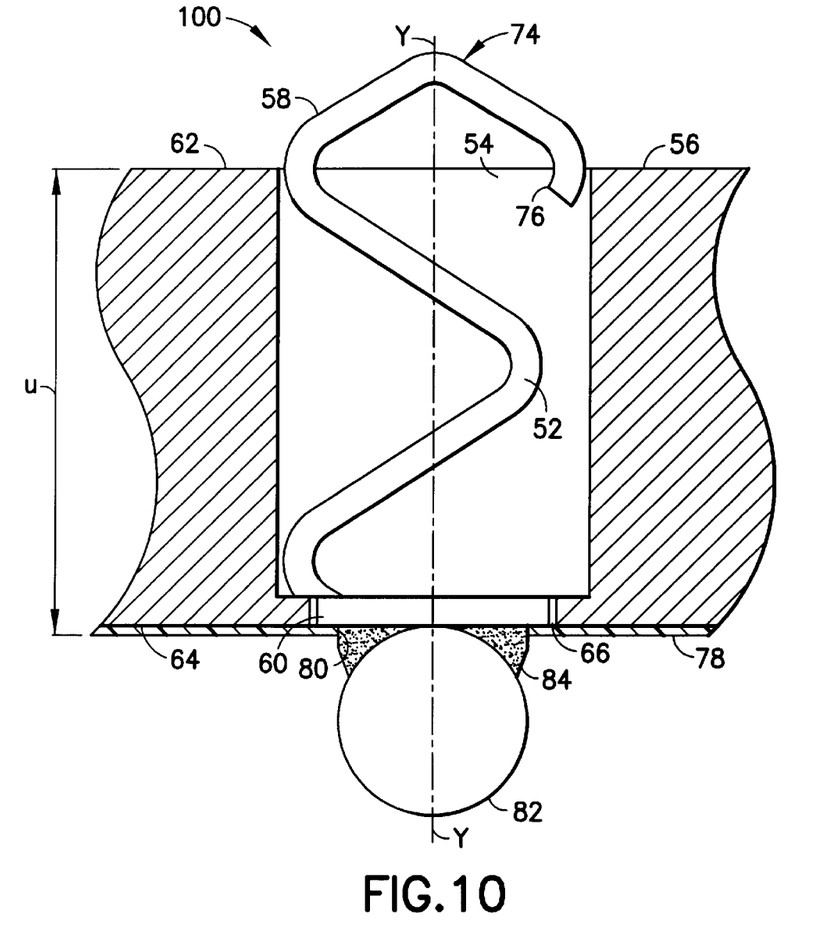
FIG. 10 is a side view of the electrical contact of the second embodiment of the invention.

Referring to FIG. 10, a second embodiment of the invention is shown which is directed to a connector 100 which includes an electrical contact 52. The connector 100 includes a non-conductive substrate 56 which has a plurality of through holes 54 formed therethrough. The connector 100 is intended for the same uses as described above with respect to the connector 10 and, the comments regarding the number and orientation of the through holes 16 discussed above with respect to the non-conductive substrate 12 apply equally here, as well as the discussion regarding the overall dimensioning of the non-conductive substrate 12. Also, the integrated circuit 1 may be fastened to the connector 100 in similar methods as described above with respect to the connector 10.

As can be seen from FIG. 10, the electrical contact 52 is formed with a spring arm 58 and a pad portion 60. The overall length of the electrical contact 52 is greater than the thickness "u" of the substrate 56. The through holes 54 are each formed with a constant rectangular cross-section from the surface 62 of the substrate 56 to a point adjacent the surface 64 of the substrate 56. A reduced-size opening 66 extends between the surface 64 and the constant cross-section portion of the through hole 54. The reduced-size opening 66 is preferably formed with a circular shape. The pad portion 60 of the electrical contact 52 must be formed to register with the reduced-size opening 66.

Figure 11:
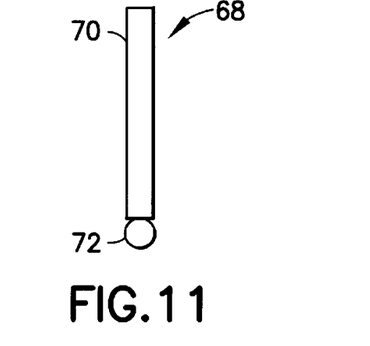
FIG. 11 is a plan view of a segment used to form the electrical contact of the second embodiment of the invention.

The electrical contacts 52 are each formed from a segment 68 of resilient conductive material, such as beryllium copper. Referring to FIG. 11, the segment 68 is formed with a rectangular length 70 and a depending circular pad 72. The electrical contact 52 is formed from the segment 68 by turning the circular pad 72 about an axis parallel to the plane of FIG. 11 and subsequently bending the rectangular member 70 to form the spring arm 58. The segment 68 and consequently the electric contact 52 is formed to have a constant width throughout. The spring arm 58 includes an apex 74 and an inwardly bent end 76. The spring arm 58 is compressible into the through hole 54 along the axis y—y, shown in FIG. 10. As described above, the compression of the electrical contact 52 causes the same wiping effect at the apex 74.

The electrical contacts 52 are mounted to the substrate 56 by causing the electrical contacts 52 to be disposed within the through holes 54 and the pad portions 60 registering with the reduced-size openings 66. Thereafter, a dry film 78 is placed coextensively on the surface 64 and the pad portions 60. Using techniques known by those skilled in the art, small apertures 80 are etched through the dry film 78 coincident with the central areas of the pad portions 60. The dry film 78 must overlap areas of the pad portions 60 and the surface 64 to maintain electrical contacts 52 within the substrate 56. To mount the connector 100 to a desired location, conductive ball leads 82 are provided for mounting to each of the pad portions 60. Solder flux 84 is disposed within the etched apertures 80 formed through the dry film 78, and the ball leads 82 are caused to be disposed thereon. Upon heating, the ball leads 82 are soldered to the respective pad portions 60.

The connector 100 can be permanently affixed to a desired location by soldering the conductive ball leads 82 thereto. In turn, the integrated circuit 1 may be fastened to the connector 100 such that the lands 3 of the integrated circuit 1 come into contact with the electrical contacts 52 wherein the surface 2 is in face-to-face engagement with the surface 62 of the connector 100. The connector 100 may be used in combination with the connector 10 to connect and mount a plurality of integrated circuits to a desired location.

As is readily apparent, numerous modifications and changes may readily occur to those skilled in the art, and hence it is not desired to limit the invention to the exact construction and operation shown and described. Accordingly, all suitable modification equivalents may be resorted to falling within the scope of the invention as claimed.

What is claimed is:

1. A connector assembly for forming a plurality of electrical connections between a land grid array package and a printed circuit board, said connector assembly comprising:

a non-conductive substrate having opposing top and bottom surfaces and a plurality of through holes extending between said top and bottom surfaces, wherein each said through hole defines a top opening through said top surface and a bottom opening through said bottom surface, said non-conductive substrate is formed from two layers, wherein said two layers are in face-to-face engagement and disposed in opposite orientations such that said through holes are symmetrically formed about the plane of engagement formed between said two layers, and wherein said through holes are defined by two pairs of opposing inner walls, where one pair of inner walls are substantially planar and the other pair of inner walls are each formed to define an outwardly pointing dihedral angle, thereby each through hole cross-sectionally defines a truncated diamond profile along one coordinate axis and a generally rectangular profile along a second coordinate axis;

a plurality of resilient electrical contacts corresponding to said plurality of through holes, each said electrical contact being disposed in a single said through hole, wherein said electrical contacts are each formed with an elongated body having two opposing ends, said body being cross-sectionally formed with an enlarged cross-section located at a point intermediate said ends, said enlarged cross-section being larger than said end cross-sections to define an elongated diamond-shaped configuration, wherein said electrical contact is generally Σ-shaped being formed with a compressible first spring arm and a compressible second spring arm, said first spring arm being disposed in said respective through hole and extending therefrom through said top surface of said substrate and said second spring arm being disposed in said respective through hole and extending therefrom through said bottom surface of said substrate, wherein said first and second spring arms are compressible in a direction generally normal to said substrate, and whereby said top and bottom openings of said through holes being formed to prevent passage therethrough of said enlarged cross-section of said respective electrical contact.

2. A connector assembly as in claim 1, wherein each said first spring arm is bent to define a first apex pointing generally away from said top surface.

3. A connector assembly as in claim 2, wherein each said first spring arm is pivotally supported such that said first apex moves simultaneously in two coordinate directions upon the compression of said first spring arm.

4. A connector assembly as in claim 1, wherein said second spring arm is bent to define a second apex pointing generally away from said bottom surface.

5. A connector assembly as in claim 4, wherein said second spring arm is pivotally supported such that said second apex moves simultaneously in two coordinate directions upon the compression of said second spring arm.

6. A method for forming a connector assembly comprising the steps of:

providing a first non-conductive layer having opposing first top and first bottom surfaces and a plurality of first through holes extending between said first top and first bottom surfaces, each said first through hole defining a first opening in said first top surface and a second opening in said first bottom surface, said first opening being larger than said second opening;

providing a plurality of electrical contacts corresponding to said plurality of first through holes, each said electrical contact being formed with an elongated body having two opposing ends, said body being cross-sectionally formed with an end cross-section at each said end, said body being cross-sectionally formed with an enlarged cross-section located at a point intermediate said ends, said enlarged cross-section being larger than said end cross-sections;

inducing a vacuum below said first bottom surface of said first non-conductive layer;

disposing said plurality of electrical contacts onto said first top surface of said first non-conductive layer;

urging each of said electrical contacts into a single said first through hole by vibrating said first layer;

providing a second non-conductive layer having opposing second top and second bottom surfaces and a plurality of second through holes extending between said second top and second bottom surfaces, each said second through hole defining a third opening in said second top surface and a fourth opening in said second bottom surface, said third opening being larger than said fourth opening, said plurality of second through holes corresponding to said plurality of first through holes;

disposing said second top surface of said second non-conductive layer into face-to-face engagement with said first top surface of said first non-conductive layer with said electrical contacts being interposed therebetween; and bonding said first non-conductive layer to said second non-conductive layer.

7. A connector assembly for forming a plurality of electrical connections between a land grid array package and a printed circuit board, said connector assembly comprising:

a non-conductive substrate having opposing top and bottom surfaces and a plurality of through holes extending between said top and bottom surfaces, wherein each said through hole defines a top opening through said top surface and a bottom opening through said bottom surface, said through holes being formed with a constant rectangular cross-section from the top surface to a point adjacent the bottom surface wherein a circular reduced-size opening extends between said bottom surface and said constant cross-section;

a plurality of resilient electrical contacts corresponding to said plurality of through holes, each said electrical contact being disposed in a single said through hole, wherein said electrical contacts are $\Sigma$-shaped each formed with a compressible first spring arm, said first spring arm being disposed in said respective through hole and extending therefrom through said top surface of said substrate, wherein said first spring arms are compressible in a direction generally normal to said substrate, wherein a disc-shaped pad portion depends from said first spring arm, said pad portion being formed to register with the circular reduced-sized opening of said respective through hole, wherein a conductive ball lead is mounted to said pad portion of each said electrical contact.

* * * * *